(12) United States Patent
Smith, Jr.

(10) Patent No.: US 11,018,631 B2
(45) Date of Patent: May 25, 2021

(54) SWITCH CIRCUITS HAVING INTEGRATED OVERDRIVE PROTECTION AND RELATED TRANSMIT/RECEIVE CIRCUITS AND MMIC AMPLIFIERS

(71) Applicant: Cree, Inc., Durham, NC (US)

(72) Inventor: Thomas J. Smith, Jr., Raeigh, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 16/783,223

(22) Filed: Feb. 6, 2020

(65) Prior Publication Data

US 2020/0177136 A1 Jun. 4, 2020

Related U.S. Application Data

(63) Continuation of application No. 15/983,527, filed on May 18, 2018, now Pat. No. 10,594,268.

(51) Int. Cl.
| | |
|---|---|
| *H03F 1/26* | (2006.01) |
| *H03F 3/213* | (2006.01) |
| *H03F 3/193* | (2006.01) |
| *H03F 3/195* | (2006.01) |
| *H01L 29/78* | (2006.01) |
| *H04B 7/08* | (2006.01) |
| *H04B 17/13* | (2015.01) |
| *H01L 29/20* | (2006.01) |

(52) U.S. Cl.
CPC ............ *H03F 1/26* (2013.01); *H01L 29/2003* (2013.01); *H01L 29/78* (2013.01); *H03F 3/193* (2013.01); *H03F 3/195* (2013.01); *H03F 3/213* (2013.01); *H04B 7/0868* (2013.01); *H04B 17/13* (2015.01); *H03F 2200/294* (2013.01)

(58) Field of Classification Search
CPC . H03F 1/26; H03F 3/213; H03F 3/193; H03F 3/195; H03F 2200/294; H03F 2200/451; H03F 3/245; H03F 3/72; H03F 1/523; H01L 29/78; H01L 29/2003; H04B 7/0868; H04B 17/13; H04B 17/0085
See application file for complete search history.

(56) References Cited

U.S. PATENT DOCUMENTS

| | | | |
|---|---|---|---|
| 8,164,389 B2 * | 4/2012 | Sun .......................... | H03F 1/52 330/298 |
| 8,421,122 B2 | 4/2013 | Smith et al. | |
| 8,487,705 B2 * | 7/2013 | Yao .......................... | H03F 3/19 330/298 |
| 2016/0036395 A1 * | 2/2016 | Quaglietta .............. | H03F 1/523 455/75 |
| 2018/0026592 A1 * | 1/2018 | Wallis ................... | H04B 1/1607 330/302 |
| 2018/0226367 A1 * | 8/2018 | Babcock ................ | F21V 23/006 |
| 2019/0229757 A1 * | 7/2019 | Vaillancourt ........ | H04B 1/0458 |

* cited by examiner

*Primary Examiner* — Ankur Jain
(74) *Attorney, Agent, or Firm* — Myers Bigel, P.A.

(57) ABSTRACT

Monolithic microwave integrated circuits are provided that include a substrate, a transmit/receive selection device that is formed on the substrate, a high power amplifier formed on the substrate and coupled to a first RF port of the transmit/receive selection device, a low noise amplifier formed on the substrate and coupled to a second RF port of the transmit/receive selection device and a protection circuit that is coupled to a first control port of the transmit/receive selection device.

19 Claims, 6 Drawing Sheets

SWITCH CIRCUITS HAVING INTEGRATED OVERDRIVE PROTECTION AND RELATED TRANSMIT/RECEIVE CIRCUITS AND MMIC AMPLIFIERS

STATEMENT OF U.S. GOVERNMENT INTEREST

This invention was made with Government support under Contract No. 11-D-5309 awarded by the Department of Defense. The Government has certain rights in the invention.

CROSS-REFERENCE TO RELATED APPLICATION

The present application claims priority under 35 U.S.C. § 120 to U.S. patent application Ser. No. 15/983,527, filed May 18, 2018, the entire content of which is incorporated herein by reference.

FIELD

The inventive concepts described herein relate to microelectronic devices and, more particularly, to microelectronic devices having overdrive protection.

BACKGROUND

Most radio frequency ("RF") electronic devices may be damaged or even destroyed if subjected to high RF signal levels. In many cases, the damage may be caused by high current levels flowing through the RF electronic device, which can result in overheating that may damage or destroy circuits within the device. The damaging RF signal levels may come from a variety of sources, some of which may be unpredictable, such as lightning strikes or RF signals transmitted by other nearby transmitters. Additionally, RF electronic devices may be damaged or destroyed when subjected to over-voltage conditions (i.e., voltage levels are applied to the device that are higher than the voltage that the device is rated to handle). This is particularly true with RF electronic devices formed from materials such as gallium arsenide ("GaAs") or indium phosphide ("InP") based semiconductor materials that have relatively lower critical breakdown fields as compared to, for example, devices formed from wide-bandgap materials such as gallium nitride ("GaN") based semiconductor materials which have much higher critical breakdown fields.

One example of an RF electronic device that may be susceptible to damage when exposed to high RF signal levels is a low noise amplifier. As is known in the art, a low noise amplifier is an amplifier circuit included in many RF communications systems that is used to amplify a received RF signal before the received RF signal is passed to a receiver. Typically, the power level of RF signals that are passed to a low noise amplifier are relatively low, as the RF signals have typically been transmitted over an air interface and hence have been subjected to free space losses, which may be quite high in many cases. Low noise amplifiers may be susceptible to damage if an RF signal having a high power level is input thereto.

SUMMARY

Pursuant to some embodiments of the present invention, monolithic microwave integrated circuits are provided that include a substrate, a transmit/receive selection device that is formed on the substrate, a high power amplifier formed on the substrate and coupled to a first RF port of the transmit/receive selection device, a low noise amplifier formed on the substrate and coupled to a second RF port of the transmit/receive selection device and a protection circuit (e.g., an overdrive protection circuit) that is coupled to a first control port of the transmit/receive selection device.

In some embodiments, the transmit/receive selection device may be a transmit/receive switch such as, for example, a single-pole double-throw switch. In other embodiments, the transmit/receive selection device may be a circulator In some embodiments, the monolithic microwave integrated circuit may further include a sampling circuit that is configured to couple a sample of an RF signal received at a third RF port of the transmit/receive selection device and to provide the sample of the RF signal to the protection circuit. The sampling circuit may be configurable to sample at least one of a first amount and a second amount of the RF signal, where the second amount is greater than the first amount. The sampling circuit may be a capacitor that is coupled to the third RF port. In some embodiments, the sampling circuit may further include a variable capacitor.

In some embodiments, the protection circuit may include an RF power detector and a control signal generator circuit that is responsive to the RF power detector, where an output of the control signal generator circuit is coupled to the first control port of the transmit/receive selection device.

The control signal generator may include a transistor that switches between an on-state and an off-state when an output of the RF power detector reaches a threshold level.

In some embodiments, the transmit/receive switch may comprise a first transistor that is coupled between a first reference voltage and a first RF transmission path that extends between the first RF port and the third RF port, a second transistor that is coupled between a second reference voltage and a second RF transmission path that extends between the second RF port and the third RF port, and a third transistor that is coupled between a third reference voltage and a first node connecting the first RF transmission path to the second RF transmission path.

In some embodiments, the protection circuit may be configured to increase reflection of RF signals received at the third RF port in response to detecting that a magnitude of the RF signal exceeds a predetermined threshold.

In some embodiments, the protection circuit may be configured to reconfigure the transmit/receive selection device in response to detecting that a level of an RF signal at the third RF port exceeds a first threshold during transmit operations and to reconfigure the transmit/receive selection device in response to detecting that the level of the RF signal exceeds a second threshold during receive operations, the second threshold being less than the first threshold.

Pursuant to further embodiments of the present invention, circuits are provided that include a substrate having a switch formed thereon that includes first through third RF ports, a first RF transmission path coupled between the third RF port and the first RF port, a second RF transmission path coupled between the third RF port and the second RF port, a first transistor that is coupled between the first RF transmission path and a first reference voltage, a second transistor that is coupled between the second RF transmission path and a second reference voltage, a third transistor that is coupled between a first node that connects the first and second RF transmission paths and a third reference voltage, and a protection circuit that is configured to turn on the third transistor in response to a level of an RF signal at the third port exceeding a preset threshold.

In some embodiments, the switch comprises a single-pole double-throw switch, the circuit further includes a high power amplifier coupled to the first RF port and a low noise amplifier coupled to the second RF port.

In some embodiments, the circuit further includes a sampling circuit that is configured to couple a sample of an RF signal received at the third RF port and to provide the sample of the RF signal to the protection circuit. The sampling circuit may comprise a capacitor voltage divider network that is coupled to the third RF port. The capacitor voltage divider network may include a variable capacitor in some embodiments.

In some embodiments, the protection circuit may include an RF power detector and a control signal generator circuit responsive to the RF power detector, where an output of the control signal generator circuit is coupled to a gate of the third transistor. In some embodiments, the control signal generator circuit may include a transistor that switches between an on-state and an off-state when an output of the RF power detector reaches a threshold level.

In some embodiments, the protection circuit may be configured to increase reflection of RF signals received at the third RF port in response to detecting that the level of the RF signal exceeds a preset threshold.

In some embodiments, a dissipative load may be provided between the third transistor and the third reference voltage.

Pursuant to additional embodiments of the present invention, transmit/receive switches are provided that include a first RF port, a second RF port, a third RF port that may be selectively connected to one of the first RF port and the second RF port, a first RF transmission path coupled between the third RF port and the first RF port, a second RF transmission path coupled between the third RF port and the second RF port, a first transistor that is coupled between the first RF transmission path and a first reference voltage, a second transistor that is coupled between the second RF transmission path and a second reference voltage, and a third transistor that is coupled between a first node that connects the first and second RF transmission paths and a third reference voltage.

In some embodiments, the transmit/receive switch further includes a protection circuit that is configured to turn on the third transistor in response to a level of an RF signal at the third port exceeding a preset threshold.

In some embodiments, the transmit/receive switch may be configured so that the third transistor turns on in response to a detection that the level of an RF signal at the third RF port exceeds a preset threshold.

Pursuant to still further embodiments of the present invention, methods of protecting an amplifier that is coupled to an antenna through a transmit/receive selection device from an overdrive condition are provided. Pursuant to these methods, a determination may be made that a level of an RF signal at an RF port of the transmit/receive selection device exceeds a preset threshold. The transmit/receive selection device may be configured to reflect RF energy received at an input thereof in response to determining that the level of the RF signal at the RF port exceeds the preset threshold.

In some embodiments, the method may also include taking a sample of the RF signal and passing the sample to an RF detector. A capacitor divider network may be used to extract the sample of the RF signal. In some embodiments, the capacitor divider network may include a variable capacitor. In some embodiments, the transmit/receive selection device may be a transmit/receive switch. In some embodiments, the preset threshold may be a first preset threshold when the transmit/receive switch operates in a transmit mode, and the preset threshold may be a second preset threshold when the transmit/receive switch operates in a receive mode, where the second preset threshold is different from the first preset threshold.

DETAILED DESCRIPTION

Figure 1:
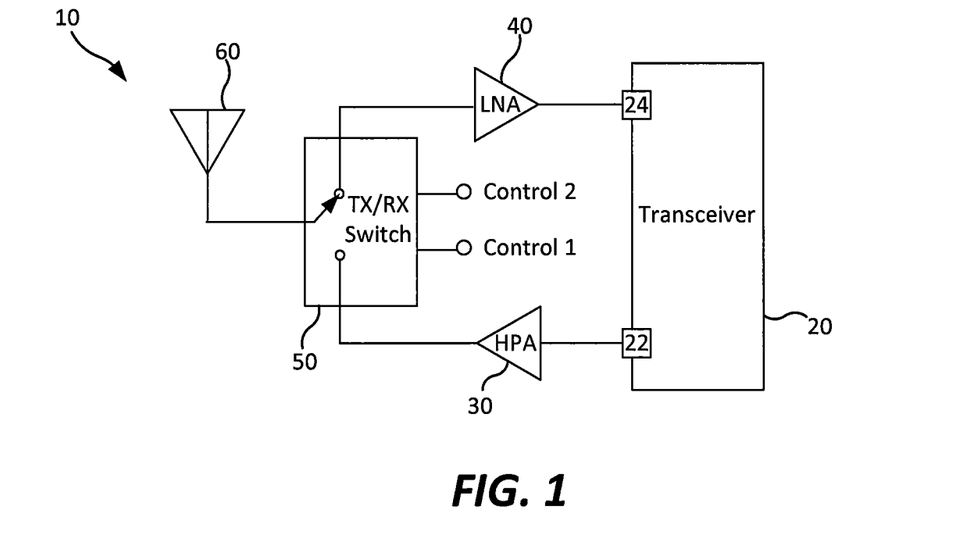
FIG. 1 is a schematic block diagram of a conventional time division duplex RF communications system.

FIG. 1 is a simplified block diagram of a time division duplexed RF communications system 10 that includes a low noise amplifier. In a time division duplexed RF communications system, the system may transmit RF signals during some time periods (called time "slots") and receive RF signals during other time slots.

As shown in FIG. 1, the RF communications system 10 includes an RF transceiver 20 that has a transmit port 22 and a receive port 24. The transmit port 22 of the RF transceiver 20 is coupled to a high power amplifier (HPA) 30, which may be used to significantly increase the power level of an RF signal output by RF transceiver 20 at port 22. Similarly, a low noise amplifier (LNA) 40 is coupled to the receive port 24 of the RF transceiver 20. A transmit/receive switch 50 is provided that selectively connects the high power amplifier 30 and the low noise amplifier 40 to an antenna 60.

The time division duplexed RF communications system 10 may operate as follows. During transmit mode time slots, the RF transceiver 20 may receive, for example, baseband data from baseband equipment (not shown) and may generate an RF signal that includes the data embedded therein. This RF signal is output from port 22 of RF transceiver 20 to the high power amplifier 30, which increases the magnitude of the RF signal. The amplified RF signal output by the high power amplifier 30 passes through the transmit/receive switch 50 to the antenna 60 that radiates the amplified RF signal into free space. The RF transceiver 20 and the transmit/receive switch 50 may be controlled so that the transmit/receive switch 50 connects the high power amplifier 30 to the antenna 60 during the transmit time slots of the time division duplex access scheme and connects the low noise amplifier 40 to the antenna 60 during the receive time slots.

During receive mode time slots, RF signals are received by the antenna 60 and passed by the transmit/receive switch 50 to the low noise amplifier 40. The low noise amplifier 40 is designed to amplify RF signals having relatively low power levels, as the RF signals are received over an air interface and hence subject to significant free space attenuation. Consequently, the low noise amplifier 40 can be subject to damage from any higher power RF signals that pass through the antenna 60 thereto. For example, RF signals that are transmitted by other nearby transceivers may be received at the antenna 60 and passed through the transmit/receive switch 50 to the low noise amplifier 40. Due to the relatively low free space loss for close-by transmitters and/or the additive effect of multiple transmitters, the received RF signal may be large enough to damage the low noise amplifier 40. As another example, if the antenna 60 is pointed towards a conductive surface, the RF signals transmitted by the RF transceiver 20 through the antenna 60 may be reflected back into the antenna 60 where they may again pass to the low noise amplifier 40. If the power level of these RF signals is sufficiently large, the low noise amplifier 40 may be damaged or even destroyed.

Hard limiter circuits may be used to protect RF electronic devices such as the low noise amplifier 40 of FIG. 1 from potentially damaging RF signal levels. Hard limiter circuits may be implemented, for example, by providing one or more protection diodes that are coupled between the RF signal path and ground. These hard limiter circuits may limit the current delivered to the low noise amplifier (or other RF electronic device) to prevent damage thereto. The hard limiter circuit may be implemented on the same chip as the RF electronic device that it protects, and an additional external (off-chip) protection circuit may be provided to supplement the on-chip hard limiter circuit. The external protection circuit may be placed, for example, between an antenna and the chip that includes the RF component to be protected so that the external protection circuit will reduce the magnitude of an RF signal received at the antenna and the on-chip protection circuit may further reduce the magnitude of the received RF signal.

Figure 2:
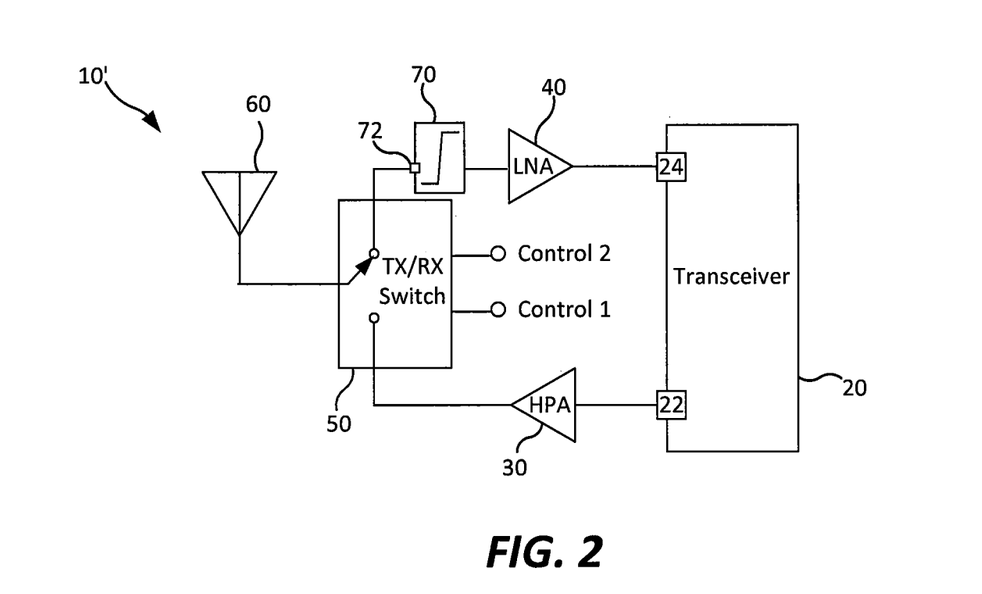
FIG. 2 is a schematic block diagram of a conventional time division duplex RF communications system that includes an integrated hard limiter circuit.

FIG. 2 is a schematic block diagram of a conventional RF communications system 10' that includes a transmit/receive circuit for a time division duplex system that has a built in hard limiter circuit that provides overdrive protection for a low noise amplifier. As shown in FIG. 2, the RF communications system 10' may be identical to the RF communications system 10, except that the RF communications system 10' further includes a hard limiter circuit 70 that is interposed between the transmit/receive switch 50 and the low noise amplifier 40. The hard limiter circuit 70 is configured to attenuate any RF signals received at an input 72 thereto, thereby protecting the low noise amplifier 40 from unintended high power RF signals that may be received at the antenna 60.

Unfortunately, the above-described conventional hard limiter circuit 70 may negatively impact the performance of the RF communications system 10 by decreasing output power, gain and/or system sensitivity, and/or by increasing the noise figure. For example, the above-described hard limiter circuit 70 may include protection diodes that may add loss and parasitic capacitance to the RF circuit path, which increases the noise figure of the low noise amplifier 40 and degrades system performance.

Pursuant to some embodiments of the present invention, monolithic microwave integrated circuits are provided that include at least one transistor amplifier and a protection circuit that may protect the amplifier from unpredictable and unintended high power RF signals. In some embodiments, the monolithic microwave integrated circuit may comprise a transmit/receive circuit for a time division duplex RF communications system. The transmit/receive circuit may include a high power amplifier, a low noise amplifier and a transmit/receive selection device such as a switch or a circulator that is used to selectively connect one of the high power amplifier and the low noise amplifier to an antenna. The transmit/receive selection device may be configured to protect upstream components of the RF communications system such as the high power amplifier and/or the low noise amplifier from high power RF signals that are unintentionally received by the antenna. Since the transmit/receive selection device is already a necessary part of many time division duplex RF communications systems, adding the overdrive protection function to the transmit/receive selection device may not add significant loss or otherwise degrade system performance.

In some embodiments, the monolithic microwave integrated circuit ("MMIC") may be configured to sample an RF signal that is input thereto (e.g., from an antenna) in order to detect a power level of the RF signal (where the "detection" may merely be determining whether or not the power level of the RF signal is above or below a predefined threshold). If the power level of the received RF signal exceeds the predefined threshold, the configuration of the transmit/receive selection device may be modified so that much of the RF energy input to the MMIC device is reflected back out to the antenna or is otherwise routed away from the transmit and receive paths that connect to an external RF transceiver. In one example implementation, the MMIC includes a single-pole double-throw transmit/receive switch. A node of this switch that connects a common RF port of the switch to the other two RF ports may be selectively connected to ground when a power level of the received RF signal exceeds the predefined threshold level. When the switch is short-circuited in this fashion, the common port will reflect a large portion of the RF energy that is input thereto, thereby protecting upstream components. Since the RF communications system will typically be designed to pass higher power RF signals along the transmit path than the receive path, the RF communications system may be configured to apply different thresholds for triggering the protection function depending upon whether the system is operating in transmit or receive mode. While the power level of the RF signal may be detected in some embodiments, it will be appreciated that other levels of the RF signal (e.g., a voltage level, a current level) may be detected instead of, or in addition to, a power level.

Since the protection circuits according to embodiments of the present invention do not require the use of high power handling, low loss diodes like conventional hard limiter circuits, the protection circuit can be implemented on the same circuit substrate as the amplifier(s) and the transmit/receive switch. In some embodiments, the amplifiers, the transmit/receive switch and the protection circuits may be implemented using gallium nitride based transistors. It can be difficult to implement high power handling, low loss diodes on the same circuit substrate on which high power gallium nitride based transistor amplifiers are implemented. Pursuant to embodiments of the present invention, all of these components may be implemented on a single monolithic microwave integrated circuit, thereby reducing the size and cost of the RF communications system.

In some embodiments, the transmit/receive switch may be implemented as an RF power detector in combination with a single-pole double-throw switch that has first through third RF ports and further includes an extra "protection" transistor that is coupled between the third RF port of the transmit/receive switch and a reference voltage such as ground. During normal operation, the protection transistor may be turned off (non-conducting) and the single-pole double-throw switch may connect the third RF port to one or the other of the first RF port (which connects to a high power amplifier) and the second RF port (which connects to a low noise amplifier) based on the values of one or more control signals that are provided to the transmit/receive switch. If the RF power detector detects that the power level of the RF signal that is present at the common port of the switch is above a predefined threshold, the protection transistor may be turned on, and the short circuit to ground acts to reflect much of the RF energy that is input to the transmit/receive switch at the common port, thereby reducing the amount of RF energy that is passed to either the low-noise amplifier and/or the high power amplifier.

In some embodiments, monolithic microwave integrated circuits are provided that include a substrate, a transmit/receive selection device that is formed on the substrate, a high power amplifier formed on the substrate and coupled to a first RF port of the transmit/receive selection device, a low noise amplifier formed on the substrate and coupled to a second RF port of the transmit/receive selection device and an overdrive protection circuit that is coupled to a first control port of the transmit/receive selection device.

In other embodiments, circuits are provided that include a substrate having a switch formed thereon. The switch includes first through third RF ports, a first RF transmission path coupled between the third RF port and the first RF port, a second RF transmission path coupled between the third RF port and the second RF port, a first transistor that is coupled between the first RF transmission path and a first reference voltage, a second transistor that is coupled between the second RF transmission path and a second reference voltage, a third transistor that is coupled between a first node that connects the first and second RF transmission paths and a third reference voltage, and an overdrive protection circuit that is configured to turn on the third transistor in response to a power level of an RF signal at the third port exceeding a preset threshold.

In still other embodiments, transmit/receive switches are provided that include a first RF port, a second RF port, a third RF port that may be selectively connected to one of the first RF port and the second RF port, a first RF transmission path coupled between the third RF port and the first RF port, a second RF transmission path coupled between the third RF port and the second RF port, a first transistor that is coupled between the first RF transmission path and a first reference voltage, a second transistor that is coupled between the second RF transmission path and a second reference voltage, and a third transistor that is coupled between a first node that connects the first and second RF transmission paths and a third reference voltage.

The RF devices according to embodiments of the present invention may help mitigate all types of overload conditions including both high current levels and overvoltage conditions. Example embodiments of the switches, transmit/receive circuits and monolithic microwave integrated circuits according to embodiments of the present invention will now be described in greater detail with reference FIGS. 3-11.

Figure 3:
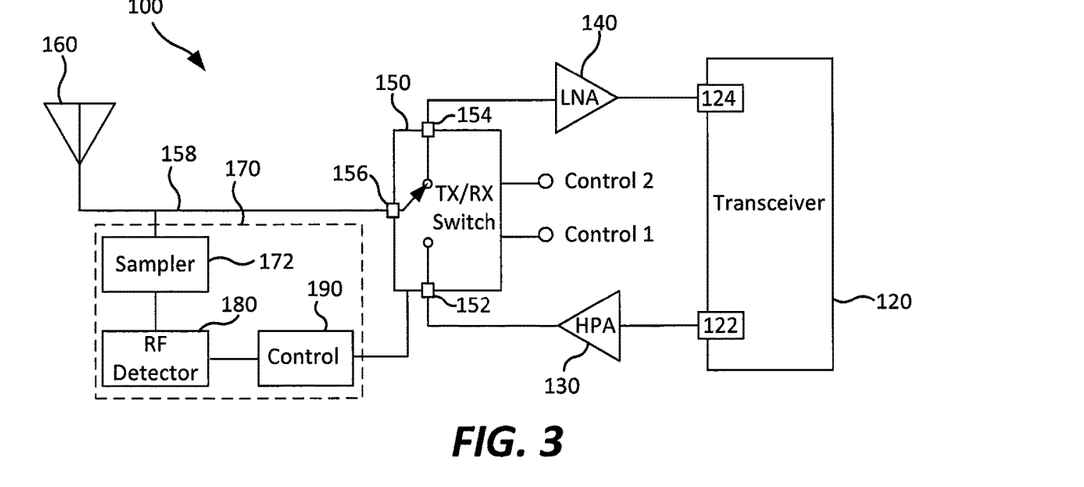
FIG. 3 is a schematic block diagram of a time division duplex RF communications system that includes a transmit/receive circuit according to embodiments of the present invention.

FIG. 3 is a schematic block diagram of a time division duplex RF communications system 100 according to embodiments of the present invention. As shown in FIG. 3, the RF communications system 100 includes an RF transceiver 120 that has a transmit port 122 and a receive port 124. The RF transceiver 120 may be connected to baseband equipment (not shown). The RF transceiver 120 may output RF signals that are to be transmitted through the transmit port 122. The transmit port 122 of the RF transceiver 120 is coupled to a high power amplifier (HPA) 130, which may be used to significantly increase the power level of the RF signal output by transceiver 120. Similarly, a low noise amplifier (LNA) 140 is coupled to the receive port 124 of the transceiver 120. A transmit/receive switch 150 according to embodiments of the present invention is provided that includes first, second and third RF ports 152, 154, 156. The high power amplifier 130 is coupled to the first RF port 152, the low noise amplifier 140 is coupled to the second RF port 154, and an antenna 160 is coupled to the third (common) RF port 156. It will be appreciated that the high power amplifier 130, the low noise amplifier 140 and the antenna 160 may be directly connected to the respective RF ports 152, 154, 156 or may be coupled to the RF ports 152, 154, 156 through intervening elements.

Additionally, the RF communications system 100 includes a protection circuit 170. The protection circuit 170 includes a sampling circuit 172, an RF detector 180 and a control signal generation circuit 190. The RF detector 180 may be connected to the RF transmission path 158 from the antenna 160 to the third RF port 156 of the transmit/receive switch 150 via the sampling circuit 172. The sampling circuit 172 may sample a small portion of the RF signal that is present on the RF transmission path 158 and pass the sampled RF signal to the RF detector 180. The RF detector 180 generates an output signal based on a level of the sampled RF signal, and passes this output signal to a control signal generation circuit 190. The control signal generation circuit 190 generates a control signal in response to the output signal from the RF detector 180 and uses this control signal to control operation of the transmit/receive switch 150. In particular, the control signal may disable the transmit/receive switch 150 when the sampled RF signal exceeds a predetermined level in order to block the flow of RF signals to the high power amplifier 130 and the low noise amplifier 140. Notably, the hard limiter used in conventional protection circuits may be omitted in the protection circuit 170 according to embodiments of the present invention.

Figure 4:
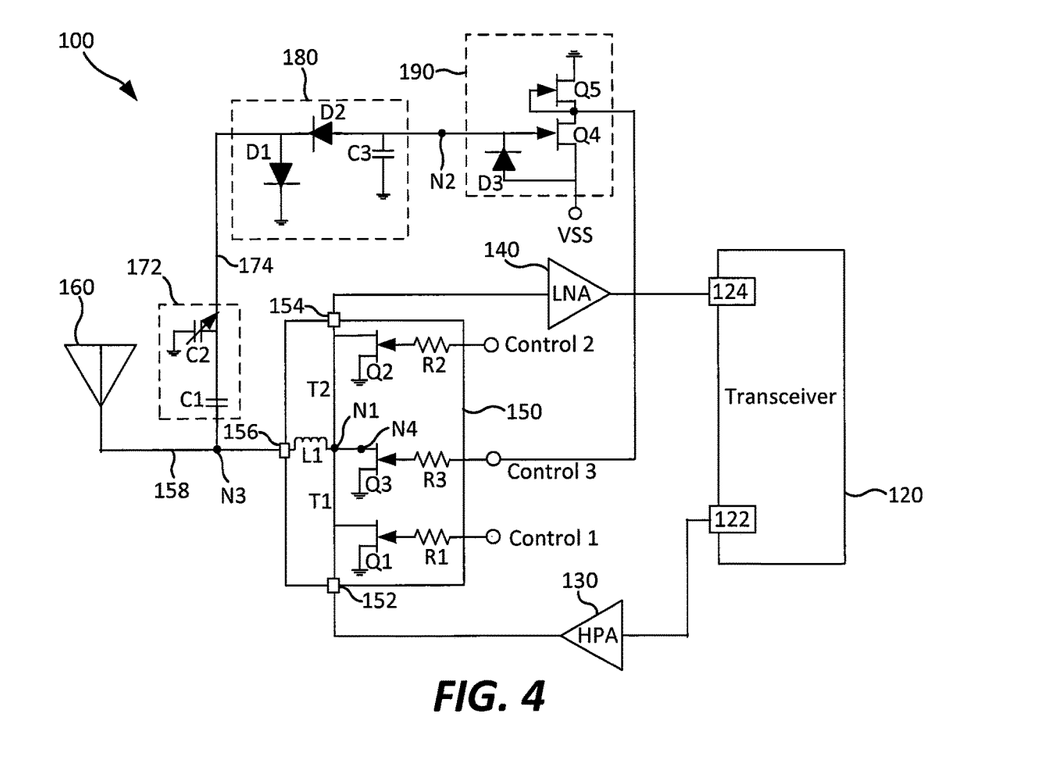
FIG. 4 is a schematic circuit diagram of an example embodiment of the RF communications system of FIG. 3.

FIG. 4 is a schematic circuit diagram illustrating one example implementation of the RF communications system 100 of FIG. 3. As shown in FIG. 4, the transmit/receive switch 150 may be implemented using various transistors, transmission lines, resistors and inductors. In the depicted embodiment, the transmit/receive switch 150 includes first, second and third transistors Q1, Q2, Q3, first and second transmission line segments T1, T2, first, second and third resistors R1, R2, R3 and an inductor L1.

The inductor L1 is coupled between the third RF port 156 and a first node N1. The inductor L1 is a conventional part of a single-pole double-throw switch and may be implemented, for example, as a spiral conductive trace on a substrate. The first transmission line segment T1 connects node N1 to the first RF port 152 and the second transmission line segment T2 connects node N1 to the second RF port 154. The first transistor Q1 has a first source/drain region that is connected to the first transmission line T1 and a second source/drain region that is connected to a first reference voltage such as ground. The gate of the first transistor Q1 is connected to a first control input Control 1 through the resistor R1. The second transistor Q2 has a first source/drain region that is connected to the second transmission line T2 and a second source/drain region that is connected to a second reference voltage such as ground. The gate of the second transistor Q2 is connected to a second control input Control 2 through the resistor R2. The third transistor Q3 is connected between node N1 and a third reference voltage such as ground. The gate of the third transistor Q3 is connected to an output of the protection circuit 170 through the resistor R3. The first transistor Q1 and the second transistor Q2 may each be about a quarter wavelength (where the wavelength is the wavelength corresponding to the operating bandwidth of the device) from node N1.

The sampling circuit 172 includes a capacitor C1 and a variable capacitor C2. The capacitor C1 couples a small portion of any RF signal that is present on the transmission path 158 and feeds the sampled portion to the RF detector 180 via a transmission path 174. The variable capacitor C2 can be coupled between the transmission path 174 and a reference voltage such as ground. The variable capacitor C2 may have, for example, two capacitance settings, one of which may be used when the transmit/receive switch 150 is set for transmission of RF signals and the other of which is used when the transmit/receive switch 150 is set for reception of RF signals. This allows the protection circuit 170 to have multiple trigger points so that the protection circuit 170 may be activated at a first RF power level during transmit operations and at a second, different RF power level during receive operations.

The RF detector 180 includes first and second diodes D1, D2 and a capacitor C3. The control signal generation circuit 190 includes a pair of transistors Q4, Q5 that are coupled in series between a voltage source VSS (which may output a negative voltage such as, for example, −20 volts DC) and a reference voltage (e.g., ground) and a diode D3. In the depicted embodiment, the control signal generation circuit 190 is implemented as an inverting DC amplifier. It will be appreciated, however, that a wide variety of different control signal generation circuits 190 could be used, and that in some embodiments, the control signal generation circuit 190 could be omitted entirely.

The circuit of FIG. 4 may operate as follows. When the RF communications system 100 is operating in receive mode, control signals are applied to control ports Control 2 and Control 3 that turn off transistor Q2 and transistor Q3, respectively. A control signal is applied to control port Control 1 that turns on transistor Q1. With these control signals, the transmit/receive switch 150 will route RF signals received at the third RF port 156 through to the second RF port 154 to the low noise amplifier 140, since the short circuit to ground through transistor Q1 will prevent RF energy from passing to the first RF port 152. Assuming that the antenna 160 is not receiving an unintended signal, then the power level of the received RF signal that is passed to the third RF port 156 is relatively small. Consequently, the sample of the RF signal that is coupled onto transmission path 174 by the sampling circuit 172 may have a low power level, and hence the voltage at node N2 (i.e., the voltage at the gate of transistor Q4) is slightly higher than VSS and transistor Q4 is forward biased (conducting). As such, the source of transistor Q5 is at about VSS (specifically, VSS minus the drain-source voltage of transistor Q4, which is small due to transistor Q4 being in its low resistance or "on" state). The source of transistor Q5 is coupled to the gate of transistor Q3 through resistor R3. When the source of transistor Q5 is at about VSS (which is a negative voltage), transistor Q3 will be turned off, and the transmit/receive switch 150 will operate like a conventional single-pole double-throw switch.

If an unintended RF signal having a high power level is received through antenna 160, the sample of this RF signal that is passed by the sampling circuit 172 to the RF detector 180 will have a larger power level. The RF detector 180 is implemented as a diode peak detector circuit that includes the small diodes D1, D2 and a capacitor C3 that convert the sample of the RF signal into a direct current ("DC") voltage. In the particular implementation of the RF detector 180 illustrated in FIG. 4, the circuit is configured to route DC current from voltage supply VSS away from the gate of transistor Q4 and so that output of the peak detector 180 will become more negative as the magnitude of the sample of the RF signal increases. As the voltage level at the gate of transistor Q4 drops, there is little change in the voltage applied to control port Control 3 so long as transistor Q4 remains forward biased. Once the voltage at the gate of transistor Q4 becomes sufficiently negative, transistor Q4 turns off, and the source of transistor Q5 goes to ground (0 volts). When this occurs, transistor Q3 turns on, connecting node N1 to ground. This in turn shorts out the transmit/receive switch 150, and hence most of the RF energy that passes from the antenna 160 toward the transmit/receive switch 150 is reflected by the third RF port 156, thereby reducing the amount of RF energy that flows to the low noise amplifier 140 (as well as to the high power amplifier 130).

When the RF communications system 100 is operating in transmit mode, the system will operate in the same manner discussed above, except that under normal operations the transmit/receive switch will connect the first RF port 152 to the third RF port 156 so that the RF signals output from the high power amplifier 130 are passed to the antenna 160. In addition, the variable capacitor C2 may be set to a different level to adjust the threshold at which the overdrive protection circuit 170 turns on the "protection transistor" Q3 in order to short circuit the transmit/receive switch 150. This allows the much larger RF signal that is output from the high power amplifier 130 to pass through the transmit/receive switch 150 without turning on the protection transistor Q3. A control circuit (not shown), which may be as simple as a single transistor, may be used to adjust the setting of the variable capacitor C2 as the transmit/receive switch 150 toggles between transmit and receive modes.

In some embodiments, the control circuit may be configured so that Control 1 and Control 2 are set to zero volts when the protection circuit 170 turns on the "protection transistor" Q3 in order to short circuit the transmit/receive switch 150. This may, in some cases, further improve the isolation between RF ports 152 and 154 with respect to RF port 156.

As shown in FIG. 4, the sampling circuit 172 connects to the transmission path 158 at a node N3. According to some embodiments, a minimum electrical distance may be provided between node N3 and node N4 of at least 1/12 of a wavelength of the RF signal (where the wavelength of the RF signal is based on the center frequency of the RF signal). The provision of the spiral inductor L1 may help ensure that this minimum distance is met. Ensuring that a minimum electrical distance is provided between nodes N3 and N4 may help ensure that the impedance at the sampling point is not reduced when transistor Q3 changes state, which would lower the sampled voltage and possibly cause the circuit to not properly operate.

While the above description discusses the protection circuit 170 being activated at various RF power levels (e.g., when a first RF power level is exceeded during transmit operation and a second, lower, RF power level during receive operations), it will be appreciated that the protection circuit may detect a parameter other than power. For example, in the embodiment of FIG. 4, the protection circuit is triggered based on a voltage at the sampling point, but the voltage at the sampling point corresponds to a power level since the transmission line impedance is fixed. Thus, herein circuit 180 is referred to as an "RF detector" as it may detect any appropriate characteristic of the sampled RF signal such as a voltage level, a power level, etc. that is used to trigger the protection circuit to change states.

Figure 5:
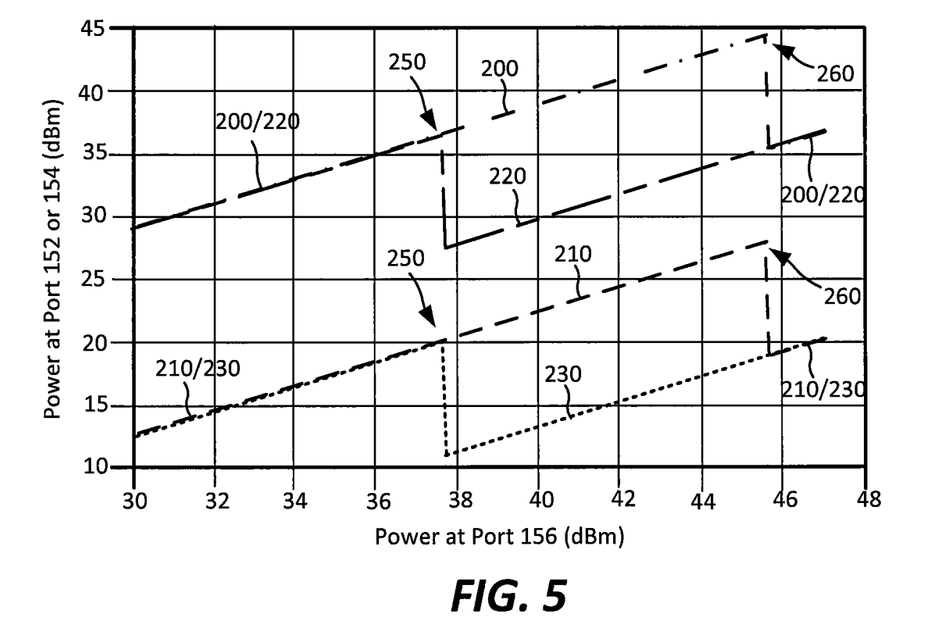
FIG. 5 is a graph illustrating the simulated output power as a function of input power for the transmit/receive switch included in the RF communications system of FIG. 4.

FIG. 5 is a graph illustrating the simulated output power of the transmit/receive switch 150 included in the RF communications system of FIG. 4 as a function of input power. In particular, curve 200 illustrates the RF power level at the first RF port 152 (which connects to high power amplifier 130) as a function of the RF power level at the third RF port 156 when the system is operating in transmit mode. As shown by curve 200, the power level of the RF signal at the first RF port 152 generally tracks the power of the RF signal at the third RF port 156 (the power is about 1 dB less due to losses within the transmit/receive switch 150) until the RF power at the third RF port reaches about 45.5 dBm. At this power level at the third RF port 156, the power at the first RF port 152 drops rapidly by nearly 10 dB, as the protection transistor Q3 turns on and much of the RF energy (nearly 90% in this example) is reflected back towards the antenna 160.

Curve 210 illustrates the RF power level at the second RF port 154 (which connects to the low noise amplifier 140) as a function of the RF power level at the third RF port 156 when the system is operating in transmit mode. As shown, curve 210 has the exact same shape as curve 200, but the power level is reduced by about 18 dB due to the isolation in the transmit/receive switch 150. As with curve 200, for power levels above 45.5 dBm, nearly 10 dB of additional isolation is achieved since the protection transistor Q3 turns on at this threshold and much of the RF energy (nearly 90% in this example) is reflected back towards the antenna 160. Curves 220 and 230 show the characteristics when the transmit/receive switch 150 is operating in receive mode. It can be seen that the exact same performance is achieved in receive mode. In FIG. 5, the points labelled 250 represent the threshold level where the protection circuit 170 starts operating when the system is operating in receive mode, while the points labelled 260 represent the threshold level where the protection circuit 170 starts operating when the system is operating in transmit mode. It should be noted that the points 250 are at a power level (at port 156) of 37.5 dBm. This trigger point is set to protect the more sensitive low noise amplifier 140 from damage. Thus, FIG. 5 illustrates that the protection circuit 170 can provide almost 10 dB reduction in the power level of a large RF signal that is input at port 156 of the transmit/receive switch, thereby protecting both the low noise amplifier 140 and the high power amplifier 130 from damage.

Referring again to FIG. 4, the transistor Q3 replaces a matching capacitor that would be included in the transmit/receive switch 150 if transistor Q3 had not been added, and hence the addition of transistor Q3 has very little impact on the performance of the transmit/receive switch 150. This is in contrast to the hard limiter protection circuit included in the RF communications 10' of FIG. 2, which introduces losses and other performance degradations such as, for example, decreased output power, lower gain, reduced efficiency, increased system sensitivity and/or an increased noise figure. Additionally, the transmit receive circuits according to embodiments of the present invention provide protection to both the low noise amplifier 140 and the high power amplifier 130, both of which are susceptible to damage. For instance, the high power amplifier 130 may be subject to damage if a conductive surface (e.g., a stabilizer on an airplane) is moved in front of the RF communications system, as such an object can reflect much of the transmitted RF energy back through the antenna 160 toward the transmit/receive switch 150. Moreover, the protection circuit 170 may be readily implemented on the same circuit substrate as one or more of the transmit/receive switch 150, the high power amplifier 130 and the low noise amplifier 140. Thus, in some embodiments of the present invention, a monolithic microwave integrated transmit/receive circuit may be provided that includes all four of the protection circuit 170, the transmit/receive switch 150, the high power amplifier 130 and the low noise amplifier 140 implemented in a single integrated circuit chip.

Figure 6:
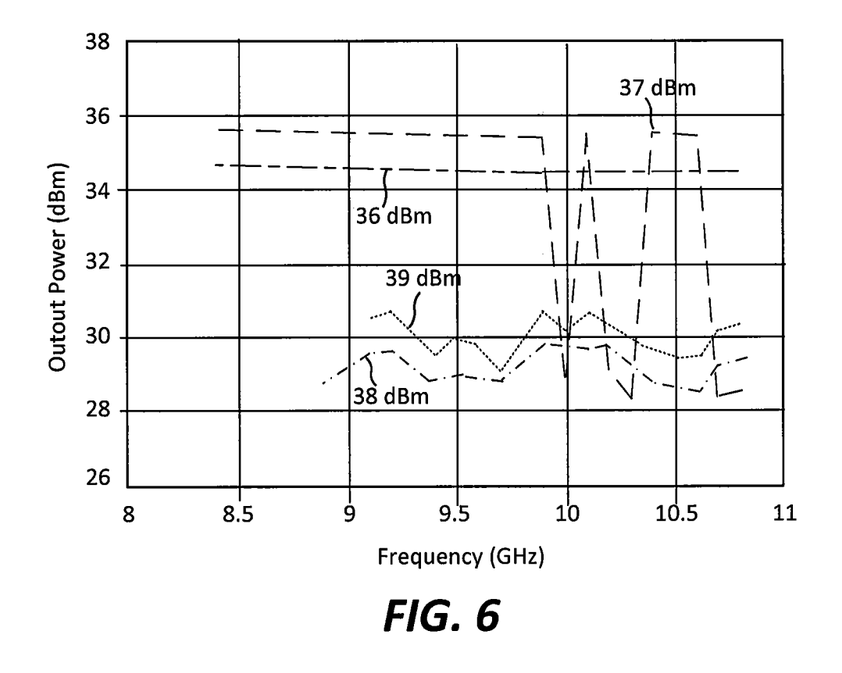
FIG. 6 is a graph of the measured output power of the transmit/receive switch of the RF communications system of FIG. 4 as a function of frequency and the power of the input signal.

FIG. 6 is a graph of the measured output power at RF port 154 of the transmit/receive switch of FIG. 4 as a function of both the frequency and the power level of the RF signal at RF port 156 when the transmit/receive switch 150 is operating in receive mode. As shown in FIG. 6, at an input power level of 36 dBm, the transmit/receive switch 150 operates similar to a conventional transmit/receive switch, and the RF power level at RF port 154 is about 34.5 dBm, representing a loss of about 1.5 dB in the transmit/receive switch 150. At input RF power levels of 38 dBm and 39 dBm, the protection circuit 170 of transmit/receive switch 150 operates normally and the RF power level at RF port 154 is reduced by about 9 dBm from the power level at RF port 156 in each case, although the response is not constant with frequency. The variation as a function of frequency may be caused by measurement limitations rather than a circuit performance issue. When the switch 150 enters protection mode, the reflected energy returns to the test system power amplifier which may cause the output power of the amplifier to change (due to this non-optimal load condition on the PA), and also reduces measurement accuracy of the incident power. At an input RF power level of 37 dBm at RF port 156, the protection circuit 170 starts to operate and transient performance is seen as protection is provided at some frequencies, but not at others.

Figure 7:
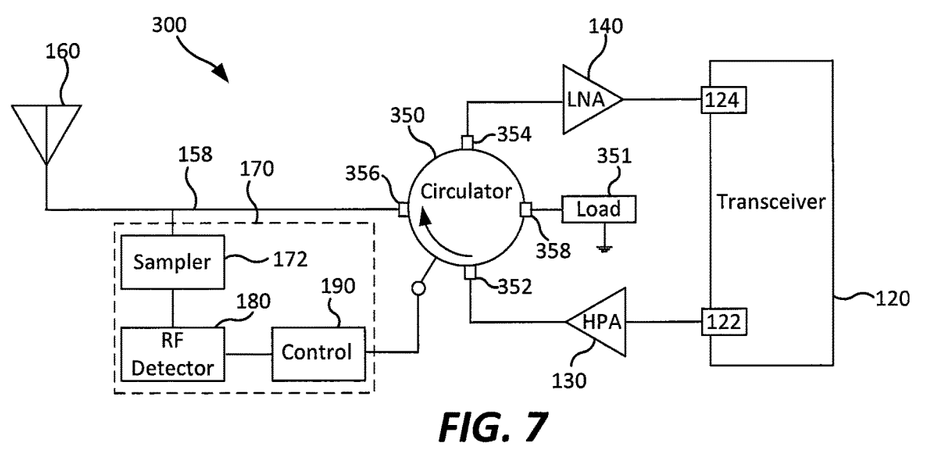
FIG. 7 is a schematic block diagram of a time division duplex RF communications system according to further embodiments of the present invention that includes a circulator.

FIG. 7 is a schematic block diagram of an RF communications system 300 according to further embodiments of the present invention. As shown in FIG. 7, the RF communications system 300 is very similar to the RF communications system 100 discussed above, except that the transmit/receive switch 150 of RF communications system 100 is replaced in RF communications system 300 with a circulator 350. As known to those of skill in the art, a circulator is an RF circuit that typically has three or four ports that is designed so that RF energy entering the device at one port is transmitted only to the next port in a direction of rotation of the circulator. The circulator 350 that is included in the RF communications system 300 may be a non-conventional circulator that is designed to reflect RF energy received at one of the RF ports thereof in response to an RF power level present at the port exceeding a predetermined threshold.

As shown in FIG. 7, the circulator 350 includes four RF ports 352, 354, 356 and 358. RF energy that is input to RF port 352 is output through RF port 356. RF energy that is input to RF port 356 is output through RF port 354. RF energy that is input to RF port 354 is output through RF port 358. In normal operations, no RF energy will be input to RF port 354, but in the event that this occurs, the RF circulator 350 will pass such RF energy to port 358 where it will be terminated in a dissipative load 351.

The RF communications system 300 may operate essentially identically to the RF communications system 100 discussed above, as the circulator 350 will functionally perform equivalent operations to the transmit/receive switch 150 of RF communications system 100. The circulator 350 may include a reflection circuit (not shown) that is configured to substantially prevent RF energy input at RF port 356 from flowing out through RF port 354 toward the low noise amplifier 140. As a result, most of the RF energy input at RF port 356 will not flow through RF port 354, but instead will continue passing through the circulator 350 and exit the circulator 350 at RF port 358, where it is terminated in a dissipative load 351. In an alternative embodiment, a three port circulator may be used that does not include RF port 358 (or the dissipative load 351). In this embodiment, a reflection circuit (not shown) may be provided at RF port 356 that, when activated, is configured to substantially prevent RF energy input at antenna 160 from passing into the circulator 350. This reflection circuit may be implemented, for example, as a circuit that debiases the magnetic ferrite of the circulator 350 to make the circulator 350 lossy in the bandwidth of the offending (undesired) RF signal. In each of the above example embodiments, a control port that is coupled to the protection circuit 170 may control the reflection circuit to activate the reflection circuit when the protection circuit 170 determines that the RF power level at RF port 356 exceeds a predefined threshold.

Figure 8:
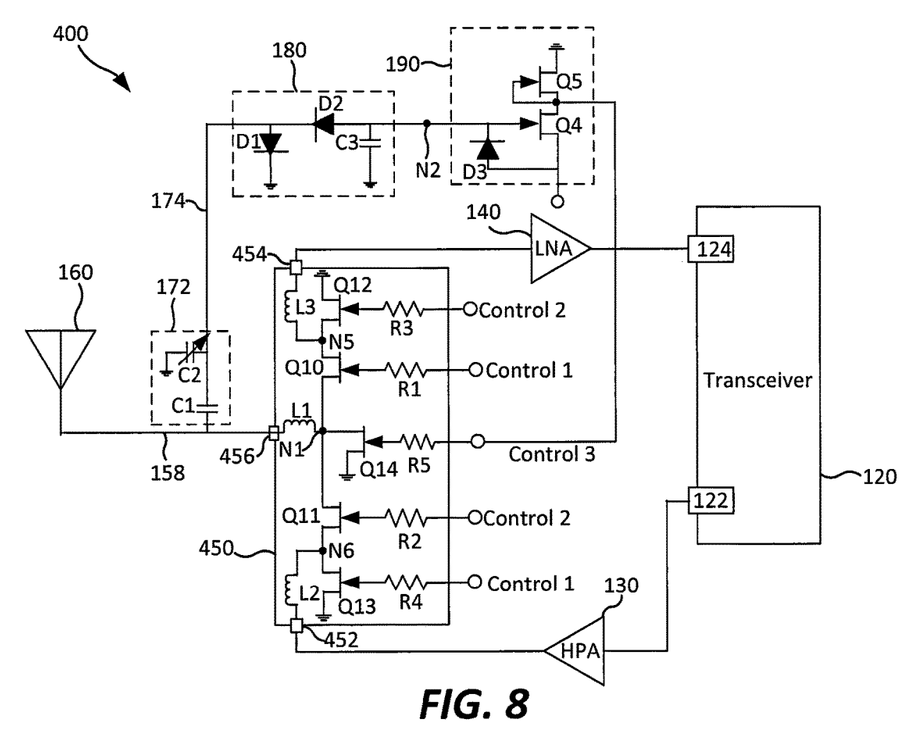
FIG. 8 is a schematic block diagram of a time division duplex RF communications system according to further embodiments of the present invention that includes a different single-pole double-throw transmit/receive switch implementation.

FIG. 8 is a schematic block diagram of an RF communications system 400 according to further embodiments of the present invention that includes a different transmit/receive switch implementation that includes a single-pole double-throw transmit/receive switch 450. The single-pole double-throw switch 450 illustrated in FIG. 8 is similar to the single-pole double-throw transmit/receive switch shown in FIG. 1 of U.S. Pat. No. 8,421,122, the entire content of which is incorporated herein by reference. However, as compared to the switch disclosed in U.S. Pat. No. 8,421,122, the single-pole double-throw switch 450 in FIG. 8 includes an additional transistor Q14 which is coupled between node N1 and a reference voltage (e.g., ground).

Referring to FIG. 8, the transmit/receive switch 450 includes a first control input Control 1, a complementary control input Control 2, and first through third RF ports 452, 454, 456. The transmit/receive switch 450 further includes five gallium nitride based HEMT transistors Q10 to Q14. The second control input Control 2 is connected through resistors R2 and R3 to gates of transistors Q11 and Q12. The first control input Control 1 is connected through resistors R1 and R4 to gates of transistors Q10 and Q13. The resistors R1 to R4 at the gates of transistors Q10 to Q13 may have relatively large resistances in some embodiments, such as, for example, resistances of about 10,000 ohms.

RF port 452 is connected through an inductance L2 to the sixth node N6. RF port 454 is connected through an inductance L3 to the fifth node N5. RF port 456 is connected through inductance L1 to the first node N1. The inductors L1 to L3 may include spiral inductor networks that are designed to match the switch on the monolithic die to 50 ohms impedance.

The RF communications system further includes the above-described protection circuit 170. As shown in FIG. 8, the output of the protection circuit is coupled to the gate of transistor Q14. The protection circuit may be configured to turn transistor Q14 on in response to detecting that the RF power level at port 456 exceeds a predefined threshold. As the RF communications system 400 may operate in essentially the same manner as the RF communications system 100 with the exception that a different single-pole double-throw switch design is used, hence further description of the RF communications system 400 of FIG. 8 will be omitted.

Figure 12:
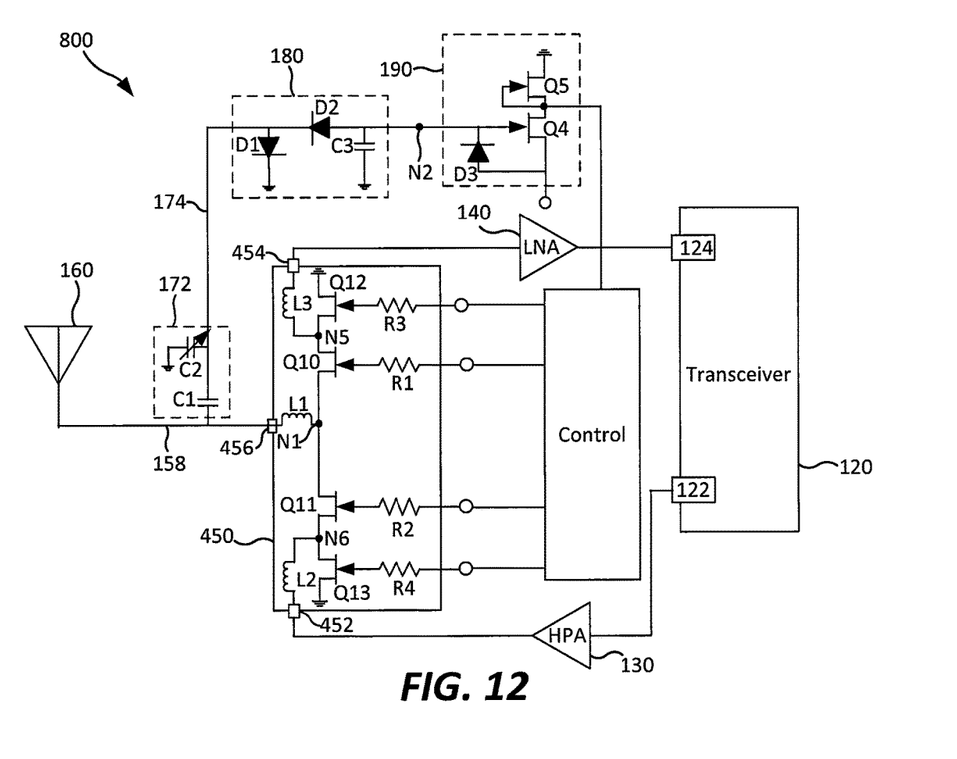
FIG. 12 is a schematic block diagram of an RF communications system according to yet additional embodiments of the present invention.

It should be noted that in the embodiment of FIG. 8 the added capacitance of the protection transistor Q14 may force reduction in sizes of the other transistors Q10-Q13, which may increase loss, and decrease power handling and isolation. Accordingly, as shown in FIG. 12, in yet another embodiment, the protection transistor Q14 may be omitted and the control circuit configured to re-bias transistors Q10 and Q11 with a large negative gate voltage while biasing transistors Q12 and Q13 to zero volts. In doing so the protection will be added without significantly impacting the RF loss, isolation, or power handling.

Figure 9:
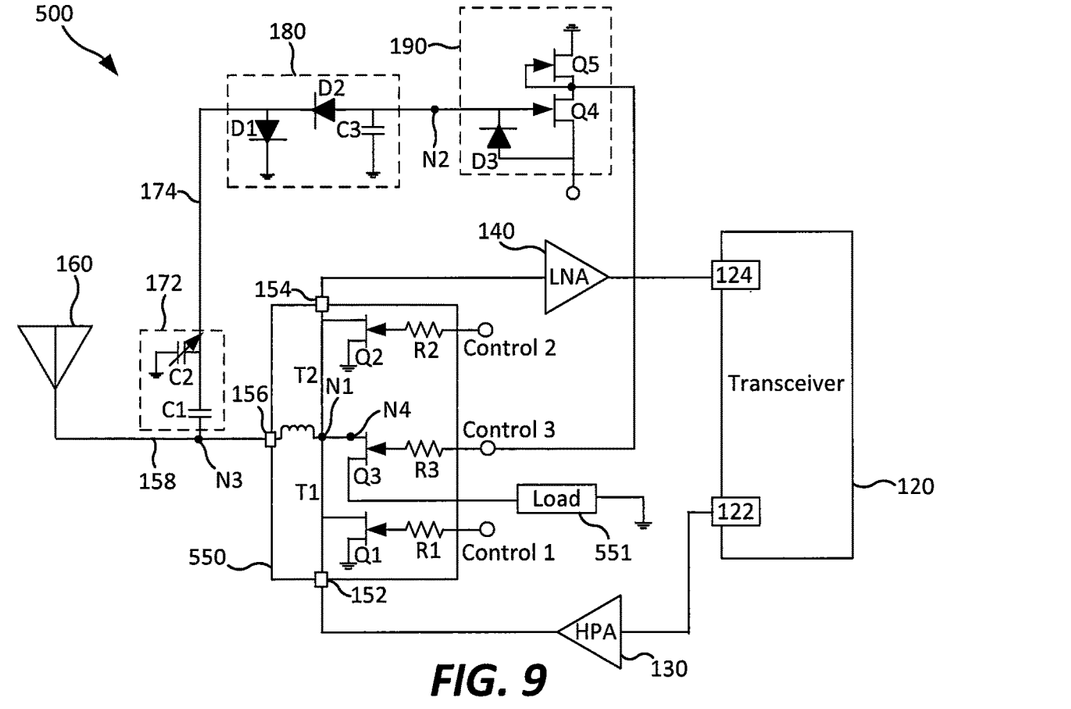
FIG. 9 is a schematic block diagram of an RF communications system according to still further embodiments of the present invention.

FIG. 9 is a schematic block diagram of an RF communications system 500 according to further embodiments of the present invention. The RF communications system 500 is very similar to the RF communications system 100 discussed above, except that the transmit/receive switch 150 of RF communications system 100 is replaced in RF communications system 500 with a transmit/receive switch 550 that is designed to couple excessive RF energy that is present at RF port 156 to a load 551 as opposed to using a short circuit to reflect the RF energy back towards the antenna 160. While not shown in FIG. 9, control circuits are coupled between Control 3 and Control 1 and Control 2 that switch Control 1 and Control 2 to zero volts when the protection circuit 170 is activated. Given the similarities between RF communications system 500 and RF communications system 100, further description of RF communications system 500 will be omitted.

As discussed above, the transmit/receive circuits according to embodiments of the present invention may be implemented as monolithic microwave integrated circuits that may include, for example, a high power amplifier, a low noise amplifier, a transmit/receive switch and a protection circuit that are all implemented on a single substrate as a monolithic integrated circuit. Such an implementation may have advantages in terms of size, cost and performance.

Figure 10:
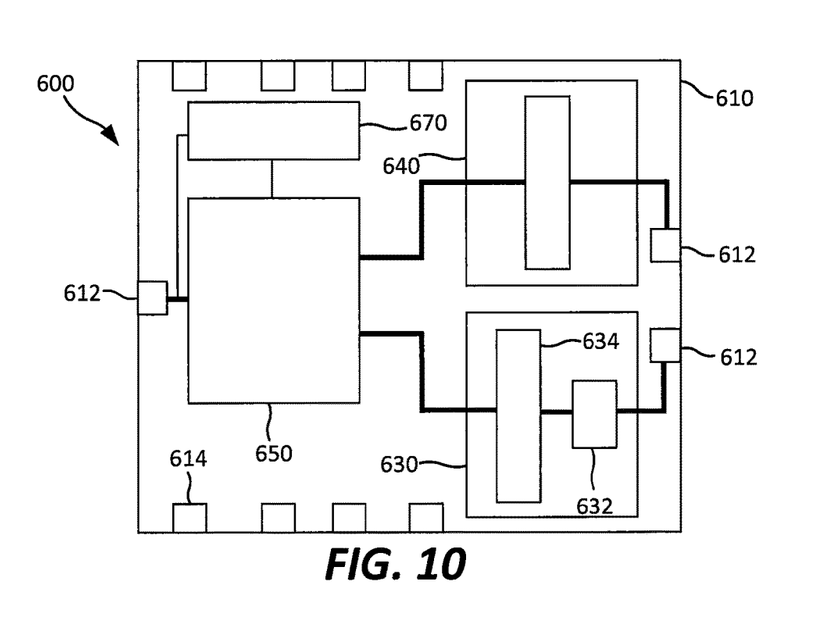
FIG. 10 is a schematic layout diagram of a MMIC RF communications system according to embodiments of the present invention.

FIG. 10 is a schematic layout view of a monolithic microwave integrated circuit implementation of a transmit/receive circuit 600 according to embodiments of the present invention. The monolithic microwave integrated circuit shown in FIG. 10 may comprise, for example, an implementation of the transmit/receive circuit portion of the RF communications system 100 of FIGS. 3-4.

As shown in FIG. 10, the transmit/receive circuit 600 includes a plurality of circuit elements that are formed on a monolithic substrate 610. The substrate 610 may comprise, for example, a silicon carbide or sapphire substrate that has gallium nitride based epitaxial layers formed thereon, or other suitable epitaxial layers such as, for example, silicon carbide or gallium arsenide based epitaxial layers. Metallization patterns and dielectric layers may also be formed on the substrate 610 to implement the various circuit elements.

The circuit elements may include a high power amplifier 630, a low noise amplifier 640 and a transmit/receive switch 650 and a protection circuit 670. The high power amplifier 630 and the low noise amplifier 640 may each comprise a gallium nitride based transistor amplifier implemented using a plurality of HEMT transistors. In the depicted embodiment, the high power amplifier 630 is illustrated as being a multi-stage amplifier that has a first plurality of unit cell transistors that form a driver amplification stage 632 and a second plurality of unit cell transistors 634 that form an output amplification stage. Each amplifier may also include one or more of an input impedance matching circuit, an output impedance matching circuit and/or inter-stage impedance matching circuit(s).

The transmit/receive switch 650 may comprise any of the transmit/receive switches according to embodiments of the present invention. For example, the transmit/receive switch 650 may comprise the single-pole double-throw switch 150 of FIG. 4. The protection circuit 670 may comprise any circuit that may control the transmit/receive switch 650 to redirect RF energy present at a common port thereof when a power level of the RF energy exceeds one or more predefined thresholds. For example, the protection circuit 670 may comprise the protection circuit 170 shown in FIG. 4. The transmit/receive switch 650 further includes input/output pads 612 and additional power and ground pads 614.

Figure 11:
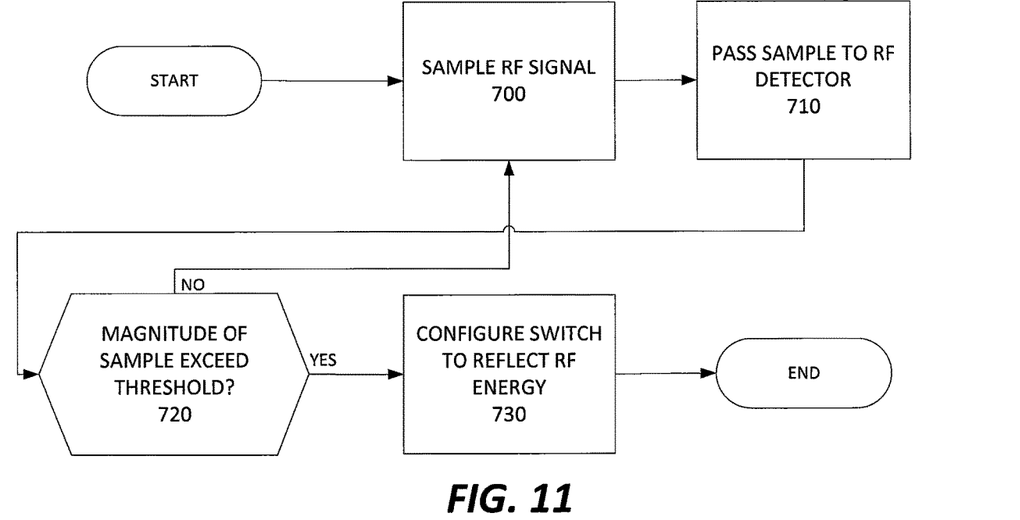
FIG. 11 is a flow chart illustrating a method of protecting an amplifier from an overdrive condition according to additional embodiments of the present invention.

FIG. 11 is a flow chart illustrating a method of protecting an amplifier that is coupled to an antenna through a transmit/receive selection device from an overdrive condition according to certain embodiments of the present invention. As shown in FIG. 11, operations may begin with an RF signal that is at an input port of the transmit/receive selection device being sampled (block 700). In some embodiments, the transmit/receive selection device may be a single-pole double-throw switch. The sample of the RF signal may be taken using, for example, a capacitor divider network. The sample of the RF signal may be passed to an RF detector (block 710). Next, a determination may be made as to whether or not a power level of an RF signal that is present at an RF port of the transmit/receive selection device exceeds a preset threshold (block 720). In response to this determination, the transmit/receive selection device may be configured to reflect RF energy received at the input port thereof (block 730).

It will be appreciated that the above embodiments are exemplary in nature and are not intended to be limiting to the scope of the present invention. It will also be appreciated that numerous modifications may be made to the above-described embodiments without departing from the scope of the present invention. As one simple example, the antenna 160 illustrated in the above embodiments is schematically shown as comprising a linear array of radiating elements such as are used in phased array antennas. it will be appreciated that the antenna 160 may comprise any appropriate antenna, including dipole, patch, reflector, horn, loop and numerous other antennas, and may include a single radiating element or surface or multiple radiating elements/surfaces, which may or may not be phase controlled. As another example, while the above described embodiments are implemented as monolithic microwave integrated circuits, it will be appreciated that the various elements of the communications system may be implemented as separate integrated circuits or other elements.

As another example, it will be appreciated that the present invention can be implemented in a wide variety of different switches, including switches other than transmit/receive switches and including switches other than single-pole double-throw switches. For example, in other embodiments, the systems could include a single-pole single-throw switch, a triple pole switch, etc. Thus, it will be appreciated that the scope of the present invention is defined by the attached claims rather than by the example embodiments that are described in detail herein. It will also be appreciated that the above-described embodiments may be combined in any fashion. For example, the technique discussed with reference to FIG. 9 where the excess RF energy is passed to a load could be used in any of the other embodiments. It will likewise be appreciated that in some embodiments, the transmit/receive circuits may have different numbers of control inputs than shown in the above example embodiments.

The transmit/receive switches according to embodiments of the present invention may exhibit low signal loss, low distortion, high power handling, low DC power dissipation, and good impedance match characteristics. The transmit/receive switches disclosed herein may also provide high levels of isolation between a non-selected port (i.e., the RF port connected to the high power amplifier when the switch operates in receive mode, and the RF port connected to the low noise amplifier when the switch operates in transmit mode) over a wide frequency band.

Embodiments of the inventive concepts may be particularly well suited for use in connection with electronic circuits that are formed in Group III-nitride based semiconductor materials. As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds such as AlGaN and AlInGaN. These compounds all have empirical formulas in which one mole of nitrogen is combined with a total of one mole of the Group III elements.

For example, many high power transistor amplifiers are formed using GaN-based high electron mobility transistor (HEMT) devices. Suitable structures for GaN-based HEMTs that may be used to implement the amplifiers included in embodiments of the present invention are described, for example, in commonly assigned U.S. Publication No. 2017/0271497, published Sep. 21, 2017, the disclosure of which is incorporated herein by reference in its entirety The transistors included in the devices according to embodiments of the inventive concepts may include a semiconductor structure that is a multiple layer structure. For example, each transistor may be formed on a substrate which may be, for example, a silicon carbide (e.g., 4H-SiC or 6H-silicon carbide, sapphire, aluminum nitride, aluminum gallium nitride, gallium nitride, silicon, GaAs, LGO, ZnO, LAO, InP and the like. A semiconductor structure may be formed on an upper surface of the substrate. The semiconductor structure may include at least a channel layer and a barrier layer, which may be sequentially stacked on the substrate and which may each comprise Group III nitride layers. Optional buffer, nucleation, strain balancing and/or transition layers may be provided between the substrate and the channel layer. One or more capping layers, such as silicon nitride layers, may be provided on an upper surface of the barrier layer.

The channel layer may comprise, for example, a Group III-nitride, such as $Al_xGa_{1-x}N$ where $0 \leq x < 1$, provided that the energy of the conduction band edge of the channel layer is less than the energy of the conduction band edge of the barrier layer at the interface between the channel and barrier layers. The channel layer may be undoped or unintentionally doped and may have a bandgap that is less than the bandgap of the barrier layer. The channel layer may have a larger electron affinity than the barrier layer. In certain embodiments, the barrier layer is AlN, AlInN, AlGaN or AlInGaN.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A method of protecting an amplifier that is coupled to an antenna through a transmit/receive switch from an overdrive condition, the method comprising:

using an RF detector to detect a level of a radio frequency ("RF") signal at an RF port of the transmit/receive switch;

determining that the level of the RF signal at the RF port of the transmit/receive switch exceeds a preset threshold;

transmitting a control signal to the transmit/receive switch in response to determining that the level of the RF signal at the RF port exceeds the preset threshold; and configuring the transmit/receive switch to be disabled and to reflect RF energy received at the RF port in response to the control signal.

2. The method of claim 1, wherein using an RF detector to detect the level of the RF signal comprises taking a sample of the RF signal and passing the sample to the RF detector.

3. The method of claim 2, wherein taking the sample of the RF signal and passing the sample to an RF detector comprises using a capacitor divider network to extract the sample of the RF signal.

4. The method of claim 3, wherein the capacitor divider network includes a variable capacitor.

5. The method of claim 2, wherein a sampling circuit that is used to take the sample of the RF signal comprises a capacitor that is coupled to the RF port and a variable capacitor.

6. The method of claim 5, wherein the sampling circuit is configurable to sample at least one of a first amount and a second amount of the RF signal, wherein the second amount is greater than the first amount.

7. The method of claim 2, wherein an output of the RF detector is coupled to a control signal generator circuit, wherein an output of the control signal generator circuit is coupled to a control port of the transmit/receive switch.

8. The method of claim 7, wherein the control signal generator comprises a transistor that switches between an on-state and an off-state when an output of the RF detector reaches a threshold level.

9. The method of claim 8, wherein the amplifier comprises a high power amplifier that is connected to a first RF port of the transmit/receive switch, a low noise amplifier that is connected to a second RF port of the transmit/receive switch, and the RF port is a third RF port of the transmit/receive switch.

10. The method of claim 9, wherein the transmit/receive switch comprises:

a first transistor that is coupled between a first reference voltage and a first RF transmission path that extends between the first RF port and the third RF port;

a second transistor that is coupled between a second reference voltage and a second RF transmission path that extends between the second RF port and the third RF port; and a third transistor that is coupled between a third reference voltage and a first node connecting the first RF transmission path to the second RF transmission path.

11. The method of claim 10, wherein a control terminal of the third transistor is coupled to the first control port.

12. The method of claim 10, wherein a dissipative load is provided between the third transistor and the third reference voltage.

13. The method of claim 1, wherein the amplifier is a high power amplifier having an output port coupled to the switch.

14. The method of claim 1, wherein the level of the RF signal is a power level of the RF signal.

15. The method of claim 1, wherein the RF signal is a signal that is received through the antenna.

16. The method of claim 1, wherein the amplifier comprises a low noise amplifier, and wherein the low noise amplifier, a high power amplifier, and the transmit/receive switch are implemented together on a single substrate as a monolithic microwave integrated circuit.

17. The method of claim 1, wherein the transmit/receive switch comprises a single-pole double-throw switch.

18. A method of protecting an amplifier that is coupled to an antenna through a transmit/receive switch from an overdrive condition, the method comprising:

determining that a level of a radio frequency ("RF") signal at an RF port of the transmit/receive switch exceeds a preset threshold; and configuring the transmit/receive switch to be disabled and to reflect RF energy received at the RF port in response to a control signal and determining that the level of the RF signal at the RF port exceeds the preset threshold, wherein the preset threshold comprises a first preset threshold when the transmit/receive switch operates in a transmit mode, and wherein the preset threshold comprises a second preset threshold when the transmit/receive switch operates in a receive mode, where the second preset threshold is different from the first preset threshold.

19. A method of protecting an amplifier that is coupled to an antenna through a transmit/receive switch from an overdrive condition, the method comprising:

determining that a level of a radio frequency ("RF") signal at an RF port of the transmit/receive switch exceeds a preset threshold; and configuring the transmit/receive switch to be disabled and to reflect RF energy received at the RF port in response to a control signal and determining that the level of the RF signal at the RF port exceeds the preset threshold, wherein configuring the transmit/receive switch to reflect RF energy received at the RF port comprises connecting a node of the transmit/receive switch that connects the RF port to a pair of additional RF ports of the transmit/receive switch to ground.

* * * * *